United States Patent [19]

Ghannouchi et al.

[11] Patent Number: 5,274,333
[45] Date of Patent: Dec. 28, 1993

[54] FREQUENCY BALANCED SIX-PORT REFLECTOMETER WITH A VARIABLE TEST PORT IMPEDANCE

[75] Inventors: Fadhel M. Ghannouchi, Verdun; Renato G. Bosisio, Ville Mont-Royal, both of Canada

[73] Assignee: La Corporation de l'Ecole Polytechnique, Montreal, Canada

[21] Appl. No.: 853,481

[22] Filed: Mar. 17, 1992

[51] Int. Cl.$^5$ .......................................... G01N 27/04
[52] U.S. Cl. .................................. 324/638; 324/642; 324/601; 333/263
[58] Field of Search ................ 333/263; 324/637, 638, 324/642, 601

[56] References Cited

U.S. PATENT DOCUMENTS

| | | | |
|---|---|---|---|
| Re. 25,396 | 6/1963 | Weinschel | 324/641 |
| 4,616,120 | 10/1986 | Maruyama | 324/646 |
| 5,041,803 | 8/1991 | Shindhara | 333/263 |

OTHER PUBLICATIONS

"The Six-Port Reflectometer: An Alternative Network Analyzer", Glenn F. Engen, IEEE Transactions on Microwave Theory and Techniques, vol. MTT-25, No. 12, Dec. 1977, pp. 1075-1079.
"Calibrating The Six-Port Reflectometer by Means of Sliding Terminations", Glenn F. Engen, IEEE Transactions on Microwave Theory and Techniques, vol. MTT-26, No. 12, Dec. 1978, pp. 951-957.
"A Six-Port Network Analyzer Load-Pull System for Active Load Tuning", F. M. Ghannouchi et al, IEEE Transactions on Instrumentation and Measurement, vol. 39, No. 4, Aug. 1990, pp. 628-631.
"An Improved Circuit for Implementing the Six-Port Technique of Microwave Measurements", Glenn F. Engen, IEEE Transactions on Microwave Theory and Techniques, vol. MTT-25, No. 12, Dec. 1977, pp. 1080-1083.

Primary Examiner—Kenneth A. Wieder
Assistant Examiner—Jose M. Solis
Attorney, Agent, or Firm—Fishman, Dionne & Cantor

[57] ABSTRACT

A source of microwave power is connected to the first, input, port of a six-port device whose second, output, port is connected to a device under test. A variable impedance is connected between the source and the input port. Preferably, the variable impedance is a mechanical three stub tuner. The six-port device includes a first directional coupler whose first input comprises the input port and whose first output comprises the output port. First, second and third hybrid couplers have outputs which constitute the third, fourth, fifth and sixth outputs of the six-port device. A power divider connects the directional coupler to the hybrid couplers.

4 Claims, 3 Drawing Sheets

PD : POWER DIVIDER
Q₁ : 10 dB DIRECTIONNAL COUPLER
Qk : (k=2,3,4) 3 dB HYBRID COUPLERS
A : ATTENUATOR
Pk : DIODE DETECTOR

FREQUENCY BALANCED SIX-PORT REFLECTOMETER WITH A VARIABLE TEST PORT IMPEDANCE

BACKGROUND OF THE INVENTION

1. Field of the Invention

The invention relates to a frequency balanced six-port reflectometer. More specifically, the invention relates to such a six-port reflectometer having a variable impedance at the test port input thereof.

2. Description of Prior Art

The characterization of active microwave devices is generally accomplished by the measurement of S parameters using, for example, Automatic Network Analyzers (ANA). The test port impedance of the ANA seen by the active device under test is the normal line characteristic impedance of the measurement system (50 Ω). It is noted that such test port impedance cannot normally be varied during measurements as is explained in reference manuals of such ANA's and well known in the art. Such a constraint is not convenient when measuring active devices with negative resistance, e.g. diodes, transistors, etc., because oscillations might occur during such measurement whenever the negative resistance of the device exceeds 50 Ω.

The use of six-port devices as an alternative to ANA's to measure such characteristics as reflection coefficients, S parameters, and impedance is designed in most cases with a fixed internal test port impedance generally near the characteristic line impedance (50 Ω) of the six-port measurement system. See, for example, U.S. Pat. No. 4,571,545, Griffin et al, U.S. Pat. No. 4,104,583, Engen and U.S. Pat. No. 4,521,728, Li. Such a six-port device is also described in G. F. Engen, "The Six-Port Reflectometer: An Alternative Network Analyzer," IEEE Trans. Microwave Theory Tech., Vol. MTT-25, No. 12, pps 1075-1083, Dec. 1977.

SUMMARY OF INVENTION

It is therefore an object of the invention to provide a frequency balanced six-port reflectometer having a variable impedance at the test port input thereof.

It is a further object of the invention to provide a six-port device which allows the variation of the test port impedance over almost all of the Smith chart.

In accordance with a particular embodiment of the invention there is provided a frequency balanced six-port reflectometer for determining characteristics of a device under test, comprising:
A) a source of microwave power;
B) a six-port device having:
 i) an input port for connection to said source;
 ii) an output port for connection to said device under test;
 iii) four detector ports, each of said detector ports being connected to a separate detector;
C) a variable impedance connected between said source and said input port.

From a different aspect, and in accordance with a particular embodiment of the invention, there is provided a six-port device, comprising:
an input port;
an output port;
first, second, third and fourth detector ports;
a directional coupler, a first input of said directional coupler comprising said input port and a first output of said directional coupler comprising said output port;
first, second and third hybrid couplers, outputs of said first, second and third hybrid couplers comprising said first, second, third and fourth detector ports; and
power dividing means for connecting said directional coupler to said hybrid couplers.

BRIEF DESCRIPTION OF DRAWINGS

The invention will be better understood by an examination of the following description, together with the accompanying drawings, in which.

DESCRIPTION OF PREFERRED EMBODIMENTS

Figure 1:
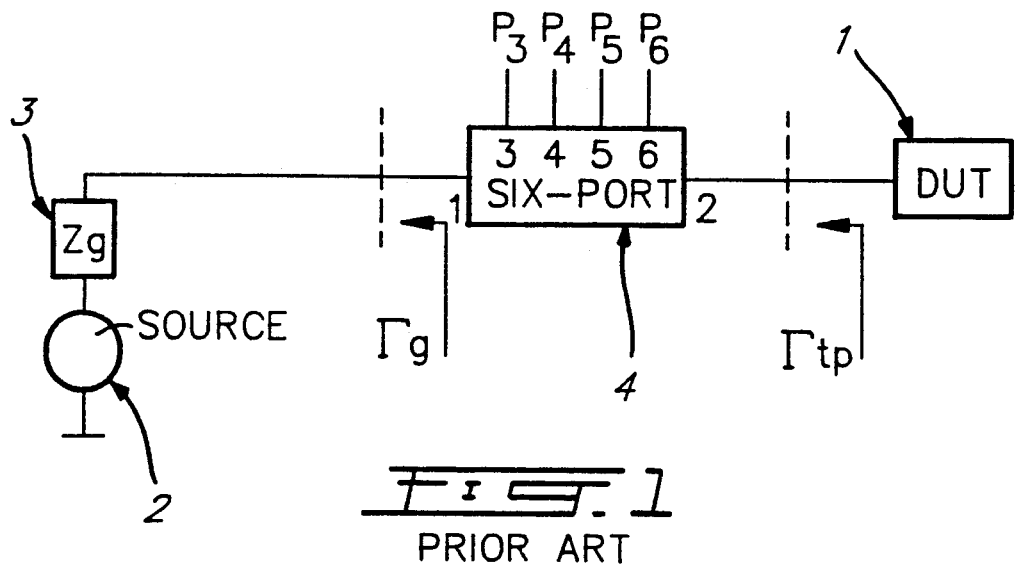
FIG. 1 illustrates a six-port reflectometer in accordance with the prior art.

FIG. 1 illustrates a six-port reflectometer as is well known in the art. In FIG. 1, a device under test (DUT) is illustrated at 1. The output of a microwave source 2, having an internal impedance 3, is fed to the input port of six-port device 4. $\Gamma_g$ is the reflection co-efficient associated with the internal impedance 3 of the source 2. Power detectors $P_3$, $P_4$, $P_5$ and $P_6$ are connected to ports 3 to 6 of the six-port device 4, and port 2 of the six-port device 4 is connected to an input of the DUT 1. $\Gamma_{tp}$ is the reflection co-efficient of the test port.

From six-port reflectometer theory, it is well known that the analysis of the operation of the reflectometer is theoretically independent of the internal impedance 3 of the source 2. The reflection co-efficient $\Gamma_{tp}$ is related to the reflection co-efficient $\Gamma_g$ as follows:

$$\Gamma_{tp} = S_{22} + \frac{S_{12}S_{21}\Gamma_g}{1 - S_{11}\Gamma_g} \quad (1)$$

where:

$S_{ij}$ are the S parameters of the equivalent two port circuit (six-port device with four power detectors connected to four power detection ports).

In the case when the six-port device includes a main line directional coupler with low coupling, such that $|S_{12}| \simeq |S_{21}| \simeq 1$ and good return loss parameters such that $|S_{11}| \simeq |S_{22}| \simeq 0$, (1) becomes:

$$\Gamma_{tp} = \Gamma_g \quad (2)$$

Figure 2:
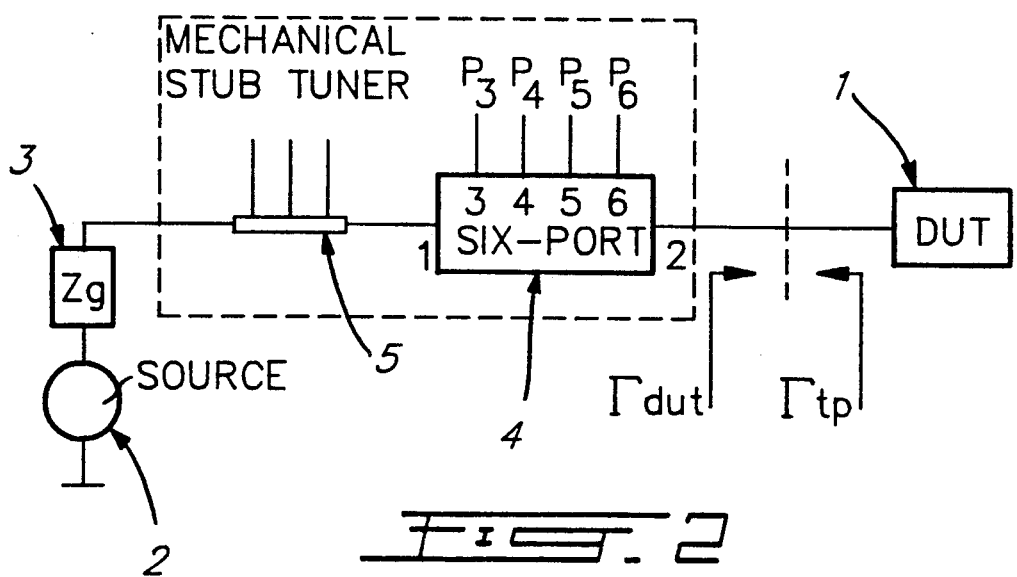
FIG. 2 illustrates a six-port reflectometer having a variable test port impedance in accordance with the invention.

To obtain a variation of the test port impedance, it is sufficient to vary the internal impedance 3 of the source 2. An arrangement which includes a means for varying the test port impedance is illustrated in FIG. 2. In FIGS. 1 and 2, like reference numerals denote like parts.

Referring to FIG. 2, the variation of the test port impedance is accomplished by use of a variable impedance 5, illustrated in FIG. 2 as a three stub tuner, inserted between the source 2 and the input port of the six-port device 4. The source 2 and the three stub tuner 5 can be considered equivalent to a generator with a variable test port impedance based on the above consideration, and by using an appropriate calibration method non-sensitive to the power level variation and to the internal impedance 3, the calibration parameters of the six-port reflectometer obtained for a given tuner stub position are valid for any position of the stubs. In FIG. 2, $\Gamma_{tp}$ is the measured reflection co-efficient of the test port, and $\Gamma_{dut}$ is the reflection coefficient of the DUT.

Figure 3:
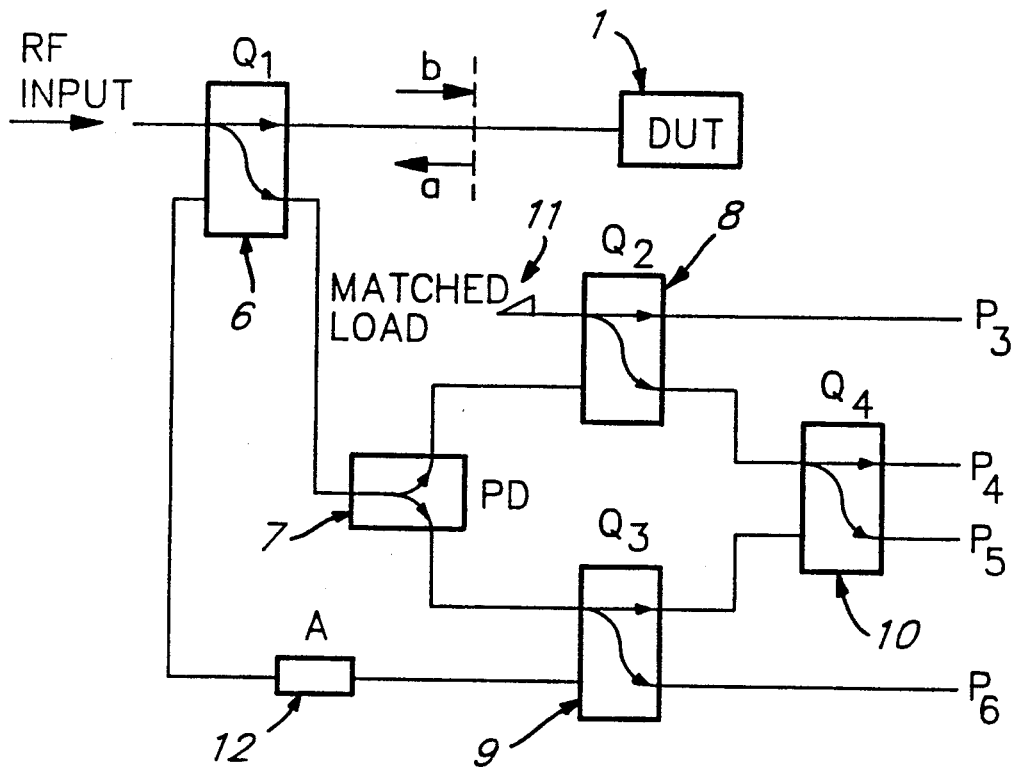
FIG. 3 illustrates a block diagram of a novel six-port device in accordance with the invention.

A circuit for a six-port device, which can be used in the six-port reflectometer in accordance with the invention, is illustrated in FIG. 3. In FIG. 3, the output of a source is fed, preferably through a variable impedance, to an input terminal of 10 dB directional coupler 6. One output of the directional coupler 6 is connected to the input of DUT 1, and the second output of directional coupler 6 is fed to the input terminal of an equal in phase, power divider 7. The outputs of 7 are fed to the input terminals of 3 dB hybrid couplers 8 and 9, and one output of each of 8 and 9 are fed to the input terminals of 3 dB hybrid coupler 10. The other outputs of 8 and 9 are fed to detectors P3 and P6 respectively, and the two outputs of 10 are fed to detectors P4 and P5 respectively. The second input of 8 is connected to a matched load 11, and the second inputs of 6 and 9 are connected to each other through attenuator 12.

With this circuit, the nominal values of the three $Q_i$ points are:

$Q_1 = 1.5 \angle -45°$ $Q_2 = 1.5 \angle -135°$ $Q_3 = 1.05 \angle 90°$

The microwave components in the circuit illustrated in FIG. 3 are connected using specific lengths of a coaxial cable. The lengths of these cables are calculated in order to minimize the rotation of the $Q_i$ points in the complex plane with frequency. The positions of the three $Q_i$ points in the complex plane between 2–6 GHz are shown in Table 1 below and are deduced from the calibration parameters of the six-port reflectometer as described in G. F. Engen, "Calibrating the six-port reflectometer by means of sliding terminations," IEEE Trans. on Microwave Theory and Techniques, Vol. MTT-26, pp. 951–957, Dec. 1978.

TABLE 1

| FREQUENCY (GHz) | Q3 mag. | Q3 pha. | Q4 mag. | Q4 pha. | Q5 mag. | Q5 pha. |
|---|---|---|---|---|---|---|
| 2.0 | .98 | −38.7 | 1.15 | −151.0 | 1.36 | 85.0 |
| 2.2 | 1.15 | −47.5 | 1.24 | −155.2 | 1.23 | 91.7 |
| 2.4 | 1.26 | −50.1 | 1.16 | −147.2 | 1.25 | 91.3 |
| 2.6 | 1.43 | −56.3 | 1.35 | −144.5 | 1.09 | 92.6 |
| 2.8 | 1.40 | −63.3 | 1.39 | −143.6 | 1.05 | 97.7 |

TABLE 1-continued

| FREQUENCY (GHz) | Q3 mag. | Q3 pha. | Q4 mag. | Q4 pha. | Q5 mag. | Q5 pha. |
|---|---|---|---|---|---|---|
| 3.0 | 1.49 | −59.1 | 1.40 | −139.9 | 1.05 | 92.8 |
| 3.2 | 1.45 | −60.7 | 1.62 | −135.5 | 0.95 | 92.9 |
| 3.4 | 1.57 | −58.0 | 1.61 | −145.3 | 0.97 | 94.8 |
| 3.6 | 1.48 | −53.6 | 1.42 | −142.7 | 1.11 | 86.9 |
| 3.8 | 1.76 | −43.8 | 1.37 | −136.7 | 1.01 | 69.8 |
| 4.0 | 2.12 | −55.5 | 1.47 | −136.7 | 0.72 | 74.6 |
| 4.2 | 1.67 | −61.9 | 1.47 | −139.3 | 0.89 | 89.3 |
| 4.4 | 1.78 | −56.6 | 1.49 | −139.6 | 0.87 | 81.2 |
| 4.6 | 1.70 | −60.4 | 1.60 | −147.9 | 0.90 | 91.4 |
| 4.8 | 1.56 | −65.1 | 1.25 | −150.0 | 1.11 | 88.2 |
| 5.0 | 1.39 | −63.5 | 1.30 | −137.9 | 1.12 | 77.8 |
| 5.2 | 1.46 | −58.9 | 1.46 | −145.2 | 0.98 | 74.3 |
| 5.4 | 1.48 | −61.6 | 1.23 | −151.6 | 1.07 | 74.7 |
| 5.6 | 1.27 | −61.8 | 1.07 | −140.1 | 1.21 | 62.2 |
| 5.8 | 1.39 | −59.8 | 1.78 | −141.4 | 0.99 | 61.2 |
| 6.0 | 1.06 | −69.4 | 1.19 | −150.4 | 1.25 | 72.3 |

As can be seen from Table 1 above, the actual positions are very close to the nominal positions above given so that the rotation of the Q points is minimized using the circuit arrangement as illustrated in FIG. 3.

The actual effect of the tuner stub positions on the measurement error was checked by measuring two different DUTs as follows:
1. 6 dB attenuator plus short circuit
2. An open offset module for five different stub positions at 3, 4 and 5 GHz. The results are shown in Table 2 below.

TABLE 2

| | 6 db attenuator + short circuit | | | Open offset 1.25 mm | | |
|---|---|---|---|---|---|---|
| | f = 3 Ghz | f = 4 Ghz | f = 5 Ghz | f = 3 Ghz | f = 4 Ghz | f = 5 Ghz |
| position 0 | .257 ∠-52.0 | .270 ∠116.7 | .219 ∠-81.5 | 1.002 ∠-8.9 | 1.002 ∠-11.8 | 1.000 ∠-14.8 |
| position 1 | .255 ∠-52.6 | .268 ∠116.8 | .218 ∠-81.3 | 1.002 ∠-8.9 | 1.003 ∠-11.8 | 1.000 ∠-14.8 |
| position 2 | .258 ∠-52.3 | .260 ∠116.5 | .219 ∠-81.1 | 1.009 ∠-8.7 | 1.003 ∠-11.7 | 1.001 ∠-14.7 |
| position 3 | .256 ∠-51.9 | .270 ∠116.7 | .219 ∠-81.1 | 1.004 ∠-8.8 | 1.000 ∠-11.8 | .997 ∠-14.7 |
| position 4 | .257 ∠-51.9 | .264 ∠117.3 | .218 ∠-81.0 | 1.001 ∠-8.9 | 1.004 ∠-11.8 | 1.000 ∠-14.8 |
| position 5 | .255 ∠-52.5 | .269 ∠116.7 | .219 ∠-81.1 | 1.002 ∠-8.8 | 1.003 ∠-11.9 | .999 ∠-14.8 |

As can be seen, the measurement error is within 0.1 in the module of $\Gamma$ and 1 percent in the argument of $\Gamma$.

Figure 4:
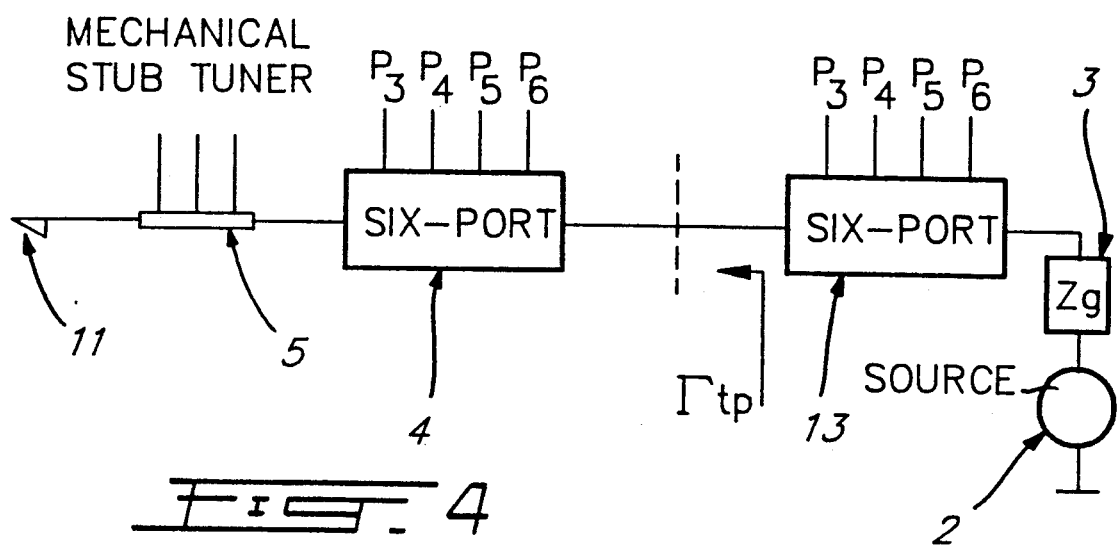
FIG. 4 illustrates an experimental set-up for evaluation of the impedance variation of the test port.

To evaluate the practical variation of the test port impedance, a second six-port device 13 was used to measure the test port reflection co-efficient $\Gamma_{tp}$ at 3 GHz produced by different positions of the mechanical stub tuner 5 as illustrated in FIG. 4.

Figure 5:
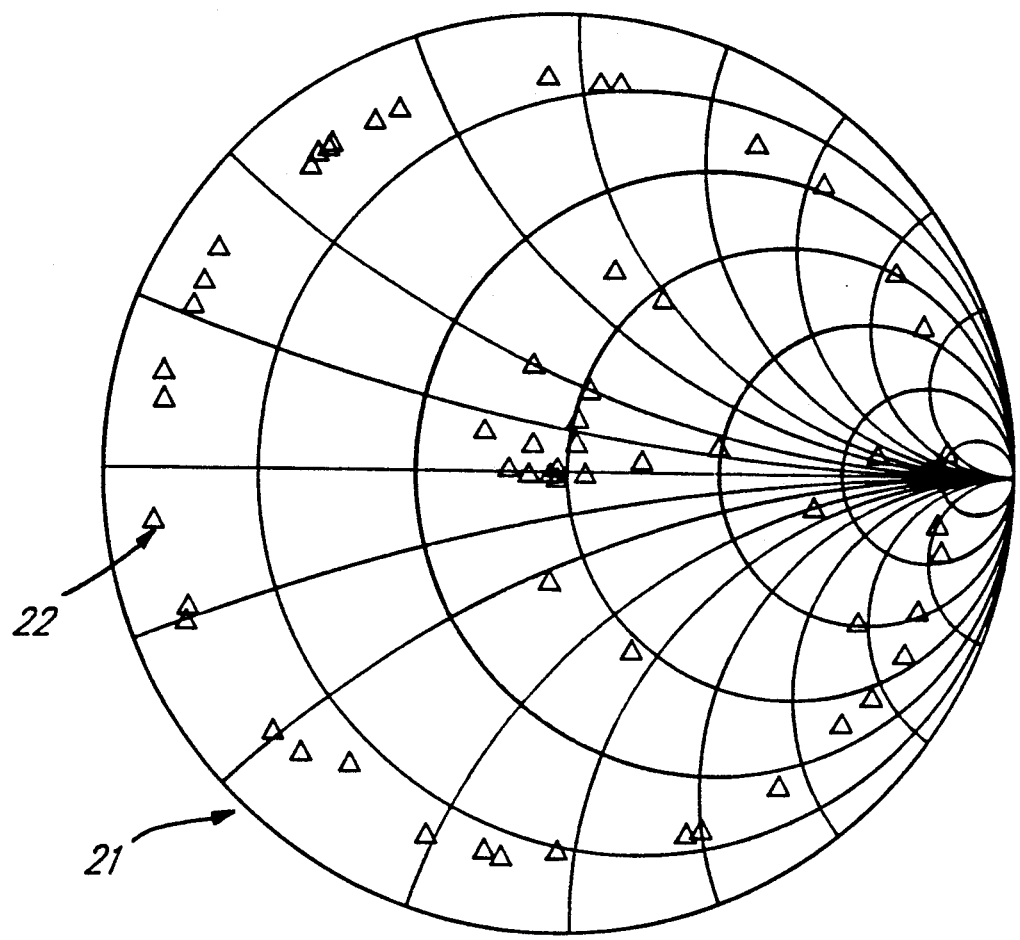
FIG. 5 illustrates, in a Smith chart, the impedance variation range of the test port.

FIG. 5 shows the regions on the Smith chart 14 where the test port impedance of the designed reflectometer can be set, namely, $0.03 \leq |\Gamma| \leq 0.9$. The limitation at the outer boundary of the Smith chart is due to insertion losses in the main line of the 10 dB directional coupler 6 (see FIG. 3) as well as the three stub tuner 5.

The six-port reflectometer with a variable impedance between the source and the input port may have potential use in the following large signal characterization of microwave active devices:

Device line measurements of one port negative resistance devices are required to optimize experimentally the added microwave power from the negative resistance devices. The large signal input impedance of the one port active device is measured as a function of the power level exciting the device generated by a monochromatic source. The variable impedance is connected to the active device, and its impedance can be changed without interrupting the measurement procedure and without affecting the measurement accuracy. This approach avoids possible oscillating conditions by keeping the total loop resistance positive.

Source-pull/load-pull oscillator measurements require the monitoring of the oscillator power and the frequency as a function of the load impedance seen by the oscillator under test. The impedance seen by the oscillator can be changed and at the same time known over the quasi-entire Smith chart by simultaneously changing and measuring the variable impedance of the six-port reflectometer in accordance with the invention.

Load-pull measurements on microwave transistors used as amplifiers are made by varying the load impedance seen by the transistor as the power absorbed by the load is monitored. This is done to optimize transistor operation according to fixed objectives (added power, efficiency, etc.). The impedance variation can easily be performed by using the six-port reflectometer with a variable impedance as per the invention herein.

Although particular embodiments have been described, this was for the purpose of illustrating, but not limiting, the invention. Various modifications, which will come readily to the mind of one skilled in the art, are within the scope of the invention as defined in the appended claims.

We claim:

1. A frequency balanced six-port reflectometer for determining characteristics of a device under test, comprising:
   A) a source of microwave power;
   B) a six-port device having:
      i) an input port for connection to said source;
      ii) an output port for connection to said device under test;
      iii) first, second, third and fourth detector ports;
      iv) a directional coupler, a first input of said directional coupler comprising said input port and a first output of said directional coupler comprising said output port;
      v) first, second and third hybrid couplers, outputs of said first, second and third hybrid couplers comprising said first, second, third and fourth detector ports; and
      vi) power dividing means for connecting said directional coupler to said hybrid couplers;
   C) variable impedance device connected between said source and said input port.

2. A reflectometer as defined in claim 1 wherein said variable impedance device has a real part and an imaginary part;
   both said real part and said imaginary part being variable.

3. A reflectometer as defined in claim 2 wherein said variable impedance device comprises a stub tuner device.

4. A reflectometer as defined in claim 2 wherein said variable impedance device comprises a 3 stub tuner.

* * * * *